United States Patent [19]
Pfleiderer et al.

[11] Patent Number: 4,605,913
[45] Date of Patent: Aug. 12, 1986

[54] TRANSVERSAL FILTER HAVING AN ANALOG SHIFT REGISTER

[75] Inventors: Hans-Joerg Pfleiderer, Zorneding; Karl Knauer, Kirchseon, both of Fed. Rep. of Germany

[73] Assignee: Siemens Aktiengesellschaft, Berlin & Munich, Fed. Rep. of Germany

[21] Appl. No.: 508,873

[22] Filed: Jun. 29, 1983

[30] Foreign Application Priority Data

Sep. 27, 1982 [DE] Fed. Rep. of Germany ....... 3235678

[51] Int. Cl.[4] .......................................... H03H 15/02

[52] U.S. Cl. .................................. 333/166; 364/824; 364/825; 377/76

[58] Field of Search ................ 333/166, 165, 138, 18; 375/103; 364/724, 825, 824; 377/76, 77, 67, 64, 57; 307/602, 603, 606, 607

[56] References Cited

U.S. PATENT DOCUMENTS 4,383,187 5/1983 Vogelsong et al. ............ 333/163 X
4,539,537 9/1985 Pfleiderer et al. .............. 333/166 X

FOREIGN PATENT DOCUMENTS 0092016 7/1980 Japan .................................. 333/165

OTHER PUBLICATIONS

K. Knauer et al, "CCD Transversal Filters with Parallel-In/Serial-Out Configuration", Siemens Forsch., vol. 7, No. 3, 1978, pp. 138–142.

*Primary Examiner*—James B. Mullins
*Assistant Examiner*—Benny T. Lee
*Attorney, Agent, or Firm*—Hill, Van Santen, Steadman & Simpson

[57] ABSTRACT

A transversal filter has an analog shift register exhibiting a series input and a plurality of parallel outputs which are connected to a summing and/or subtracting circuit. A simple realization of signal weighting circuits assigned to the stages of the shift register is achieved in that n signal weighting devices assigned to a group of n stages are disposed in a signal path which extends from the input of the first stage of the group over all stages thereof and in that the signal weighting devices of the n stages respectively weight according to filter coefficients $b_1$–$b_n$ which occur in the system function $$H(z)=b_0\cdot(1+b_1\cdot z(1+b_2\cdot z(\ldots(1+b_n\cdot z))))$$

determining the filtered signal, where z represents the delay time per stage for each signal value. The transversal filter of the invention is useful in analog filters of communications technology.

2 Claims, 2 Drawing Figures

TRANSVERSAL FILTER HAVING AN ANALOG SHIFT REGISTER

BACKGROUND OF THE INVENTION

1. Field of the Invention

The present invention relates to a transversal filter, and more particularly to a transversal filter having an analog shift register comprising a series input and a plurality of parallel outputs, in which an input signal can be supplied to the series input of the form of successively-sampled signal values and signals may be tapped at the parallel outputs and supplied to a summer and/or subtractor whose output signal represents the filtered signal, and in which a plurality of signal weighting devices are assigned to the stages of the shift register.

2. Description of the Prior Art

A transversal filter of the general type set forth above is known, for example, from the publication Siemens Forschungs- und Entwicklungsberichten, Vol. 7, No. 3, 1978, Springer-Verlag 1978, pp. 138–142, with particular reference to FIG. 1*a*. Weighting factors $a_0$–$a_n$ are assigned to the signal weighting devices of the individual register stages which are connected in series with the parallel outputs, the weighting factors corresponding to the filter coefficients referenced $a_0$–$a_n$ in the equation $$H(z)=a_0=a_1\,z+a_2\cdot z^2+\ldots+a_n\cdot z^n \tag{1}$$

where H(z) represents the system function of the filtered signal and z represents the delay time which a sampled signal value experiences when traversing one stage of the shift register. It is disadvantageous, however, that the weighting factors $a_0$–$a_n$ can assume greatly divergent values for realizing specific filter curves, thus complicating realization of the filter circuit.

SUMMARY OF THE INVENTION

The object of the present invention, therefore, is to provide a transversal filter of the type generally set forth above which is more simply constructed with respect to the signal weighting devices and can be more precisely matched to a desired filter curve than is the case given conventional filters.

According to the invention, the above object is achieved in a transversal filter of the type generally set forth above and is characterized in that the n signal weighting devices assigned to a group of n stages are disposed in a signal path extending from the input of the first stage of the group over all stages thereof, and in that the signal weighting devices of the first through $n^{th}$ stage of the group respectively weight to filter coefficients $b_1$–$b_n$ which are determined in that the filter meets the system function $$H(z)=b_0\cdot(1+b_1\cdot z\,(1+b_2\cdot z\,(\ldots(1+b_n\cdot z)))),$$

where z represents the delay respectively occurring for one stage of the shift register when the sampled signal values are transferred.

The advantage which may be attained in practicing the present invention is that the evaluation factors $b_0$–$b_n$ on which the signal weighting devices are based exhibit significantly smaller differences relative to one another than do the weighting factors $a_0$–$a_n$ required for realizing one and the same filter curve with a traditional transversal filter.

BRIEF DESCRIPTION OF THE DRAWING

Other objects, features and advantages of the invention, its organization, construction and operation will be best understood from the following detailed description, taken in conjunction with the accompanying drawing, on which.

DESCRIPTION OF THE PREFERRED EMBODIMENTS

Figure 1:
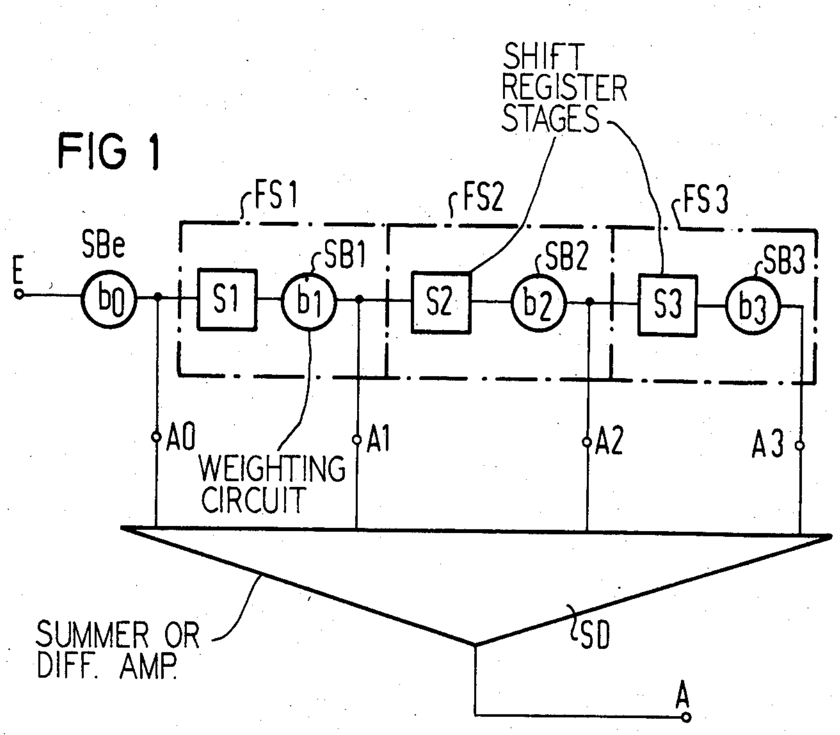
FIG. 1 is a schematic representation of a first exemplary embodiment of the invention.

The basic circuit diagram of a first embodiment of a transversal filter constructed in accordance with the invention is illustrated in FIG. 1. It comprises a three-stage, analog shift register whose stages are referenced S1–S3. The input of the stage S1 is connected via a weighting factor $b_0$ to the filter input E which receives an input signal to be filtered. The stages S1–S3 are respectively provided with parallel outputs A1–A3 which are connected to respective inputs of a summer or of a differential amplifier SD. The output of the circuit SD simultaneously represents the filter output A. An input signal to be filtered is available at the input E is periodically sampled by a previous sampling stage (not illustrated in detail) connected in series with the input E or alternatively by the stage S1 and the signal is therefore dissected into individual sample values. A signal weighting circuit SB1 is connected in series with the stage S1, the signal weighting device weighting each signal value traversing the stage S1 with a weighting factor $b_1$. Signal weighting devices SB2 and SB3 are similarly connected in series with the stages S2 and S3 and weight all signal values proceeding over the stages S2 and S3 with the weighting factor $b_2$ or, respectively, with the weighting factor $b_3$ in a corresponding manner. The stage S1 is preceded by a signal weighting device SBe which weights with a factor $b_0$, this device being connected in series with the input E, whereby a further parallel output A0 is connected such that the samples of the input signal diverted thereover only traverses the weighting device SBe but not the other signal weighting devices.

The filter output signal appearing at the output A is composed of the individual samples of the input signal in the following manner. It is assumed, for purpose of illustration, that a sample of the input signal evaluated with the factor $b_0$ is tapped at the output A0 at a prescribed time. Added to this, in the circuit SD, is that sample of the input signal which was sampled earlier by a specific time interval z, was transmitted over the stage S1 and the signal weighting device SB1 and tapped at the output A1. This sample experienced a delay time z while traversing the stage S1. Further added is that sample of the input signal which was sampled two intervals prior, i.e. 2z, before the prescribed time, which was transmitted over the stages S1 and S2 and is tapped at the output A2. When traversing the signal weighting devices SB1 and SB2, this sample was weighted with the factors $b_1$ and $b_2$ and was also delayed by the respective delay time z while traversing the stage S1 and while traversing the stage S2. Finally, another sample must be added, this having been sampled three intervals prior, i.e. 3z, before the prescribed time, having been transmitted over the stages S1, S2 and S3 in succession, this sample experiencing a weighting with the factor $b_1$, $b_2$ and $b_3$ and a delay time z in each of the stages S1–S3. All of the samples have traversed the signal weighting device SBe which provides the weighting factor $b_0$. When the samples tapped at the outputs A0–A3 at the prescribed time are combined in the circuit SE, then the relationship $$H(z)=b_0\cdot(1+b_2\cdot z\,(1+b_2\cdot z\,(1+b_3\cdot z))) \quad (2)$$

occurs at the output A for the sum signal, whereby it is presumed that the function value of the input signal to be filtered does not significantly change during the three time intervals, i.e. 3z, but respectively corresponds to a standardized value 1.

When the shift register having the stages S1–S3 illustrated in FIG. 1 is analogously expanded to a shift register having a group of n stages S1–Sn, where n signal weighting devices SB1–SBn with weighting factors $b_1$–$b_n$ and n parallel outputs A1–An are assigned thereto, then equation (2) can be replaced by the more general equation $$H(z)=b_0\cdot(1+b_1\cdot z\,(1+b_2\cdot z\,(\ldots(1+b_n\cdot z)))). \quad (3)$$

A mathematical comparison of equation (3) to equation (1) shows that the respectively described system functions H(z) are completely identical when the weighting factors $b_i$ (where $i=1\ldots n$) derive from the filter coefficients $a_i$ (where $i=1\ldots n$) in the following manner:

$$b_i=a_i/(a_{i-1});\ b_o=a_o. \quad (4)$$

This means that each transversal filter of the type initially mentioned can be replaced by a filter according to FIG. 1 which has been expanded to n stages S1–Sn, whereby the weighting factors $b_i$ of the signal weighting devices SB1–SBn are respectively represented as quotients $a_i/a_{i-1}$ of two filter coefficients of equation (1). Although the values $a_i$ can differ greatly for specific filter curves, mutually adjacent values $a_i$ and $a_{i-1}$ do not diverge very greatly from one another so that values likewise diverging only relatively slightly from one another derive for the weighting factors $b_i$ of the signal weighting devices SB1–SBn employed in a transversal filter constructed in accordance with the invention. Therewith, however, the signal weighting devices SB1–SBn are relatively simple to realize.

Characteristic of the transversal filter according to the present invention is that, given the use of a shift register having a group of n stages, all n signal weighting devices assigned to these stages lie in one signal path extending from the input of the first stage over all n stages. Given three stages S1–S3 in FIG. 1, for example, the signal weighting devices SB1–SB3 assigned to these stages are disposed in a signal path which extends from the input of the stage S1, over the stage S1, the signal weighting device SB1, the stage S2, the signal weighting device SB2, the stage S3 and the signal weighting device SB3 up to the parallel output A3 of the third stage. The circuit elements S1, SB1 in FIG. 1 are combined into a first filter stage FS1 having the parallel output A1; the circuit elements S2, SB2 are combined into a second filter stage FS2 having the parallel output A2; and the circuit elements S3, SB3 are combined into a third filter stage FS3 having the parallel output A3.

Figure 2:
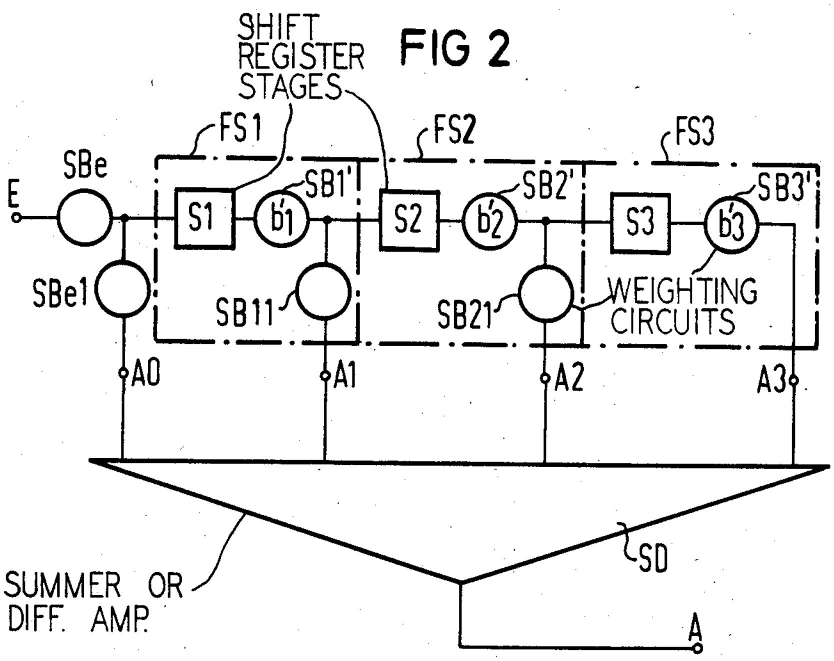
FIG. 2 is a schematic representation of a second exemplary embodiment of the invention.

A further development of the filter according to FIG. 1 is illustrated in FIG. 2, this being advantageously employed when the weighting factors $b_1$, $b_2$ and $b_3$ given an execution according to FIG. 1 are greater than 1 or smaller than 0. When, for example, the weighting factor $b_3$ (FIG. 1) is greater than 1 or smaller than 0, i.e. negative, then it is standardized to a value $b_3'$ (FIG. 2) which is smaller than or equal to 1 but greater than 0. This occurs in that $b_3$ is divided by a divisor $\pm D_3$. As compensation for this, a further signal weighting device SB21 must, on the one hand, be provided in series with the parallel output A2 of the second stage S2, the further signal weighting device SB21 weighting the samples tapped at the output A2 with a weighting factor $\pm 1/D_3$ and, on the other hand, the weighting factor $b_2$ (FIG. 1) of the second stage S2 must be multiplied by the divisor $\pm D_3$. When the weighting factor $b_2$ thereby arising is, in turn, greater than 1 or smaller than 0, then it is divided by a divisor $\pm D_2$ so that a standardized weighting factor $b_2'$ again arises. As compensation for this, a further signal weighting device SB11 is inserted in series with the parallel output A1, the further signal weighting device SB11 weighting with a factor of $\pm 1/D_2$, whereby, moreover, the weighting factor $b_1$ of the first stage S1 is multiplied by the divisor $\pm D_2$. When a value of the factor $b_1$ which is greater than 1 or smaller than 0 thereby derives, then a standardization of the appertaining weighting factor to a value $b_1'$ is also undertaken for the first stage S1. To this end, the factor $b_1$ is divided by a divisor $\pm D_1$ to form the value $b_1'$, a further signal weighting device SBe1 is provided in series with the parallel output A0, this weighting with a factor $\pm 1/D_1$ and the weighting factor $b_0$ of the device SBe is multiplied by the divisor $\pm D_1$.

This standardization method for the factors $b_1'$, $b_2'$ and $b_3'$ can, of course, also be analogously applied given an expansion of the filter to n register stages S1–Sn. It is thereby essential that the standardization of the weighting factor $b_i$ of the stage $S_i$ (where $i=2\ldots n-1$) leads to the fact that a further signal weighting device is provided in series with the parallel output of the stage $S_{i-1}$, the further signal weighting device for utilizing a weighting factor of $\pm 1/D_i$ and that the signal waiting device of the stage $S_{i-1}$ weights with a corrected weighting factor $b_{i-1}\cdot(\pm D_i)$.

In a realization of a transversal filter according to the present invention, the signal weighting device SBe can be eliminated since it only signifies an amplification or attenuation of the input signal to be filtered, and this can be undertaken externally of the filter.

Although we have described our invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of our contribution to the art.

We claim:

1. A transversal filter comprising:

a filter input for receiving an input signal;

a shift register including a plurality of serially-connected stages including an input stage connected to said filter input and a plurality of parallel outputs each from a separate stage;

signal combining means connected to said plurality of parallel outputs for combining signals appearing at said outputs into an output signal representing a filtered input signal; and a plurality n of weighting devices each associated with and connected to a respective shift register stage of a group n of said stages and serially interconnecting with the next succeeding stage and providing at each serial interconnection taps constituting said plurality of parallel outputs, said weighting devices including an input weighting device providing a weighting coefficient $b_0$ connected to the input stage and the remainder of weighting devices connected to the first through the $n^{th}$ stages of said group respectively providing weighting coefficients $b_1$-$b_n$ determined such that the filtered signal meets the system function $$H(z)=b_0\cdot(1+b_1\cdot z(1+b_2\cdot z\,(\ldots(1+b_n\cdot z)))),$$

where z is the signal delay time through a single stage of said shift register.

2. The transversal filter of claim 1, wherein:

said weighting device of each $i^{th}$ stage, where $i=2\ldots n$, whose filter coefficient has a value of greater than 1 or less than 0 comprises means for normalizing the coefficient to a coefficient $b_i'$ by dividing its coefficient $b_i$ by a predetermined divisor $\pm D_i$;

and further comprising, connected in series in the parallel output of the $i-1^{th}$ stage, a further signal weighting device for further weighting the respective shift register output signal by a factor of $\pm 1/D_i$ and providing the $i-1^{th}$ stage with a corrected filter coefficient $b_{i-1}\cdot(\pm D_i)$.

* * * * *